(12) United States Patent
You

(10) Patent No.: US 8,610,491 B2
(45) Date of Patent: Dec. 17, 2013

(54) ANTI-FUSE CONTROL CIRCUIT

(75) Inventor: Jung taek You, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/351,806

(22) Filed: Jan. 17, 2012

(65) Prior Publication Data
US 2013/0135035 A1     May 30, 2013

(30) Foreign Application Priority Data

Nov. 29, 2011 (KR) .......................... 10-2011-0126140

(51) Int. Cl.
*H01H 37/76* (2006.01)
(52) U.S. Cl.
USPC ........................................ 327/525; 365/225.7
(58) Field of Classification Search
USPC ................... 327/525, 526; 365/225.7
See application file for complete search history.

(56) References Cited

U.S. PATENT DOCUMENTS

| | | | | |
|---|---|---|---|---|
| 5,956,282 A * | 9/1999 | Casper | ........................ | 365/225.7 |
| 6,144,247 A * | 11/2000 | Kim et al. | ..................... | 327/525 |
| 6,288,964 B1 * | 9/2001 | Shirley | ........................ | 365/225.7 |
| 6,346,845 B1 * | 2/2002 | Choi | ............................... | 327/525 |
| 6,741,117 B2 * | 5/2004 | Lee | ................................ | 327/525 |
| 6,920,070 B2 * | 7/2005 | Imai | .......................... | 365/189.09 |
| 7,565,518 B2 * | 7/2009 | Kuroda | ............................ | 713/1 |
| 7,924,598 B2 * | 4/2011 | Hase et al. | ..................... | 365/100 |
| 8,274,321 B2 * | 9/2012 | Chi et al. | ....................... | 327/525 |
| 2010/0164604 A1 * | 7/2010 | Park | .............................. | 327/525 |
| 2011/0188334 A1 * | 8/2011 | Kang et al. | .................... | 365/226 |
| 2011/0235453 A1 * | 9/2011 | Chi et al. | ................... | 365/225.7 |
| 2013/0021851 A1 * | 1/2013 | Chang et al. | ............. | 365/189.05 |

FOREIGN PATENT DOCUMENTS

| | | |
|---|---|---|
| KR | 1020040007904 A | 1/2004 |
| KR | 10-0756784 B1 | 8/2007 |

* cited by examiner

*Primary Examiner* — Thomas J Hiltunen
(74) *Attorney, Agent, or Firm* — William Park & Associates Patent Ltd.

(57) ABSTRACT

An anti-fuse control circuit includes a first power supply voltage application unit, a second power supply voltage application unit and a control unit. The first power supply voltage application unit configured to selectively apply first power supply voltage to an output node in response to a power up signal. The second power supply voltage application unit configured to selectively apply second power supply voltage to the output node in response to a program signal. The control unit configured to control a connection between the output node and an anti-fuse in response to the power up signal when the program signal is inactivated.

11 Claims, 3 Drawing Sheets

ANTI-FUSE CONTROL CIRCUIT

CROSS-REFERENCES TO RELATED APPLICATION

The present application claims priority under 35 U.S.C. §119(a) to Korean application number 10-2011-0126140, filed on Nov. 29, 2011, in the Korean Intellectual Property Office, which is incorporated herein by reference in its entirety as set forth in full.

BACKGROUND

1. Technical Field

Embodiments of the present invention relate to a semiconductor integrated circuit, and more particularly, to an anti-fuse control circuit for a semiconductor integrated circuit.

2. Related Art

Generally, in a semiconductor integrated circuit, a fuse used after packaging is typically referred to as an anti-fuse. The reason is that the fuse before the packaging performs a repair by cutting but the fuse used after packaging performs a repair by interconnection rather than by the cutting. That is, the anti-fuse is a term that refers to the fuse before packaging. This means a fuse that is electrically opened in a normal state and is electrically shorted when an insulator between conductors is broken due to application of high voltage.

FIG. 1 is a circuit diagram of a general anti-fuse control circuit.

In FIG. 1, the anti-fuse control circuit may be configured to include a first inverter IV1 that inverts and outputs a power up signal PWRUP, a first PMOS transistor P1 that is connected between a terminal for applying external power supply voltage Vext and a first node nd1 that receives an output signal of the first inverter IV1 through a gate thereof. The anti-fuse control circuit may also comprise a second PMOS transistor P2 that is connected between the terminal for applying the external power supply voltage Vext and the first node nd1 and the second PMOS transistor P2 which may receive a program signal PG through a gate thereof. The anti-fuse control circuit may also comprise a third PMOS transistor P3 that is connected between the first node nd1 and an anti-fuse F1 and the third PMOS transistor P3 may receive ground voltage Vss through a gate thereof. Still further, anti-fuse control circuit may comprise a third NMOS transistor N3 that is connected between the first node nd1 and the anti-fuse F1 to receive power supply voltage Vbba through a gate thereof and apply back bias voltage Vbbf to a bulk terminal.

In addition, the output terminal of the first node nd1 is formed with fourth and fifth PMOS transistors P4 and P5 and first and second NMOS transistors N1 and N2 in a cross-coupled structure and comprises a first latch unit R1 including second and third inverters IV2 and IV3. Further, a fourth inverter IV4 inverts an output of the first latch unit R1 to output an output signal anti_anz.

An operation process of the anti-fuse control circuit according to the related art will be described below in terms of a program mode and a general operation mode with reference to FIG. 1.

First, the program mode. When the program signal PG is a low level and the anti-fuse F1 is broken, the second PMOS transistor P2 is turned on. In addition, when the power up signal PWRUP is a low level, the first PMOS transistor P1 is turned off, such that the first node nd1 is set to be the level of the external power supply voltage Vext.

In this case, the level of the back bias voltage Vbbf is set to be −3V or less that is low back gate bias (LVBB). Here, the low back gate bias (LVBB) is voltage supplied from an internal voltage generator.

Generally, the anti-fuse control circuit is in a short state in which resistance is very small while the insulator of the anti-fuse F1 is broken at the time of the program mode operation.

Next, the general operation mode. In general operation mode the program signal PG is set to the high level, such that the voltage value of the first node nd1 is defined by the power up signal PWRUP. In this case, the back bias voltage Vbbf is set to be the level of the ground voltage Vss. Further, the voltage level of the power supply voltage Vbba is set to be the level of the external power supply voltage Vext to turn on the third NMOS transistor N3.

In this case, when the anti-fuse F1 is not programmed, the high level of the first node nd1 is maintained by the first latch unit R1 and the logic level of the output signal anti_anz is set to the low level by the fourth inverter IV4.

On the other hand, when the anti-fuse F1 is programmed, the voltage level of the back bias voltage Vbbf becomes the level of the ground voltage Vss. In this case, when the power up signal PWRUP is shifted to a low level, the voltage of the first node nd1 becomes the low level and thus, the signal of the high level stored in the first latch R1 becomes the low level. Therefore, an output signal of the first latch R1 is inverted by the fourth inverter IV4 and thus, the output signal anti_anz is output as the high level.

However, when the anti-fuse F1 is a general operation mode, the third PMOS transistor P3 and the third NMOS transistor N3 are in a turn on state at all times, such that the voltage of the first node nd1 is supplied to the anti-fuse F1 at all times. When the anti-fuse F1 is not programmed, even though the voltage of the first node nd1 is supplied to the anti-fuse F1 at all times in the general operation mode, the anti-fuse F1 is in an open state to prevent current leakage or malfunction due to current leakage. However, when the anti-fuse F1 is programmed, in the general operation mode, the anti-fuse F1 has a high resistance value due to the process change such that the current leakage occurs and a malfunction due to current leakage is caused.

SUMMARY

In one embodiment of the present invention, an anti-fuse control circuit includes: a first power supply voltage application unit configured to selectively apply first power supply voltage to an output node in response to a power up signal; a second power supply voltage application unit configured to selectively apply second power supply voltage to the output node in response to a program signal; and a control unit configured to control a connection between the output node and an anti-fuse in response to the power up signal when the program signal is inactivated.

BRIEF DESCRIPTION OF THE DRAWINGS

Features, aspects, and embodiments are described in conjunction with the attached drawings, in which.

DETAILED DESCRIPTION

Hereinafter, an anti-fuse control circuit according to embodiments of the present invention will be described below with reference to the accompanying drawings through example embodiments.

Figure 1:
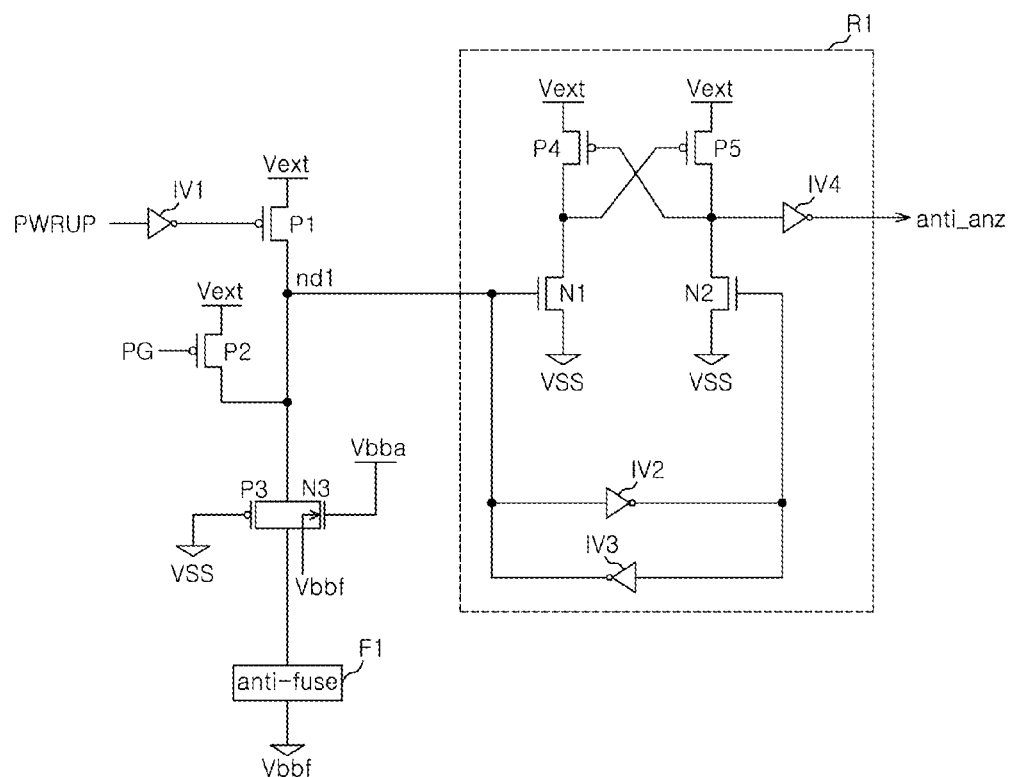
FIG. 1 is a circuit diagram of a prior art anti-fuse control circuit.
Figure 2:
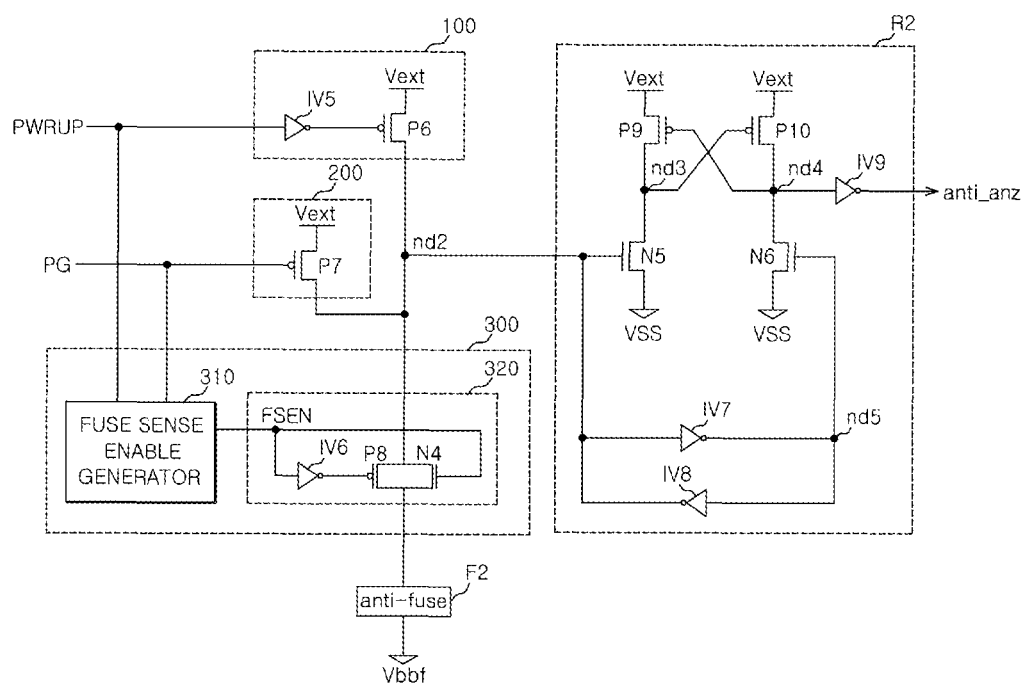
FIG. 2 is a circuit diagram of an anti-fuse control circuit in accordance with an embodiment of the present invention.

FIG. 2 is a circuit diagram of an anti-fuse control circuit in accordance with an embodiment of the present invention.

Referring to FIG. 2, the anti-fuse control circuit of an embodiment of the present invention may be configured to include a first power supply voltage application unit 100, a second power supply voltage application unit 200, an anti-fuse F2, a second latch unit R2 and a controller 300. The first power supply voltage application unit 100 may output external power supply voltage Vext to a second node nd2 in response to a power up signal PWRUP. The second power supply voltage application unit 200 may output external power supply voltage Vext to a second node nd2 in response to a program signal PG. The anti-fuse F2 may be connected between the second node nd2 and back bias voltage Vbbf. The second latch unit R2 may receive an output signal of the second node nd2 to generate an output signal anti_anz. Further, the controller 300 may is control a connection between the second node nd2 and the anti-fuse in response to the power up signal PWRUP and the program signal PG.

The first power supply voltage application unit 100 may be configured to include a fifth inverter IV5 that inverts and outputs the power up signal PWRUP and a sixth PMOS transistor P6 that is connected between an external power supply voltage Vext application terminal and the second node nd2 to receive an output signal of the fifth inverter IV5 through a gate thereof.

The second power supply voltage application unit 200 may be configured to include a seventh PMOS transistor P7 that is connected between the external power supply voltage Vext application terminal and the second node such that the seventh PMOS transistor P7 receives the program signal PG through a gate thereof.

The second latch unit R2 may be configured to include a fifth NMOS transistor N5 that is connected between a third node nd3 and ground voltage Vss to receive the output signal of the second node nd2 through a gate thereof, a sixth NMOS transistor N6 that is connected between a fourth node nd4 and ground voltage Vss to receive an output signal of a fifth node nd5, a ninth PMOS transistor P9 that is connected between the external power supply voltage Vext application terminal and the third node nd3 such that the ninth PMOS transistor receives an output signal of a fourth node nd4 through a gate thereof, a tenth PMOS transistor P10 that is connected between the external power supply voltage Vext application terminal and the fourth node nd4 such that the tenth PMOS transistor P10 receives an output signal of the third node nd3 through a gate thereof, a seventh inverter IV7 that inverts the output signal of the second node nd2 and outputs an inverted output signal to the fifth node nd5, an eighth inverter IV8 that inverts the output signal of the fifth node nd5 and outputs an inverted output signal to the second node nd2, and a ninth inverter IV9 that inverts the output signal of the fourth node nd4 and outputs the output signal anti_anz.

The control unit 300 may be configured to include a fuse sense enable signal generator 310 that generates a fuse sense enable signal FSEN in response to the power up signal PWRUP and the program signal PG and a switch unit 320 that controls the output of the second node nd2 supplied to the anti-fuse F2 in response to the fuse sense enable signal FSEN.

The switch unit 320 may be configured to include a sixth inverter IV6 that inverts and outputs the fuse sense enable signal FSEN, an eighth PMOS transistor P8 that is connected between the second node nd2 and the anti-fuse F2 to receive the output signal of the sixth inverter IV6 through a gate thereof, and a fourth transistor N4 that is connected between the second node nd2 and the anti-fuse F2 to receive the fuse sense enable signal FSEN.

When the program signal PG is in the program mode, the logic level transitions to the low level and when the program signal PG is the general operation mode, the logic level transitions to the high level.

That is, the program signal PG is activated in the program is mode and is inactivated in the general operation mode.

When the power up signal PWRUP is in the power up state, the logic level transitions to the high level and when the power up signal PWRUP is completed, the logic level transitions to the low level.

That is, the power up signal PWRUP is activated in the state in the power up state and is inactivated when the power up is completed.

An operation of the anti-fuse control circuit will be described with reference to FIG. 2.

First, the program mode. When an anti-fuse F2 is broken, the logic level of the program signal PG and the power up signal PWRUP transitions to the low level.

Therefore, a first power supply voltage driving unit 100 that receives the power up signal PWRUP of the low level is not driven and the second power supply voltage application unit 200 that receives the program signal PG of the low level is driven.

In this case, the voltage level of the second node nd2 is equal to the level of the external power supply voltage Vext applied to the second power supply voltage application unit 200.

In addition, the fuse sense enable signal generator 310 outputs the fuse sense enable signal FSEN of the high level when the logic level of the program signal PG transitions to the low level.

The switch unit 320 receives the fuse sense enable signal FSEN of the high level and supplies the voltage of the second node nd2 to the anti-fuse F2.

In this case, the level of the back bias voltage Vbbf is set to be −3V or less, that is low back gate bias (LVBB). Here, the LVBB is voltage supplied from the internal voltage generator.

During the program mode operation, the anti-fuse F2 is in a short state having very small resistance when an insulator of the anti-fuse F2 is broken due to a voltage difference between the second node nd2 and the back bias voltage Vbbf.

Meanwhile, in the general operation mode, the logic level of the program signal PG maintains the high level and the voltage value of the second node nd2 is defined by the power up signal PWRUP In this case, the level of the back bias voltage Vbbf is set to be a level of the ground voltage Vss.

When the anti-fuse F2 is not programmed, the operation of the anti-fuse control circuit will be described as follows.

First, when a semiconductor integrated circuit is in the power up state, the logic level of the power up signal PWRUP transitions to the high level.

When the power up signal PWRUP of the high level is input to the first power supply voltage application unit 100, the voltage of the second node nd2 becomes the level of the external power supply voltage Vext. The second latch unit R2 receives the output of the second node nd2 to output the output signal anti_anz of the low level.

Next, when the power up of the semiconductor integrated circuit is completed, the logic level of the power up signal PWRUP is shifted to the low level. When the power up signal PWRUP of the low level is input to the first power supply voltage application unit 100, the external power supply voltage Vext is not applied to the second node nd2. However, the anti-fuse F2 is in the open state and thus, the second latch unit R2 responds to the power up signal PWRUP of the high level so as to allow the first power supply voltage application unit 100 to maintain the external power supply voltage Vext output to the second node nd2 and output the output signal anti-anz of the low level.

On the other hand, when the anti-fuse F2 is programmed, the operation of the anti-fuse control circuit will be described as follows.

First, when a semiconductor integrated circuit is in the power up state, the logic level of the power up signal PWRUP transitions to the high level.

The fuse sense enable signal generator 310 outputs the fuse sense enable signal FSEN of the low level in response to the power up signal PWRUP of the high level and the program signal PG of the high level.

The switch unit 320 blocks voltage of the second node nd2 from being supplied to the anti-fuse F2 in response to the fuse sense enable signal FSEN of the low level.

The first power supply voltage application unit 100 outputs the external power supply voltage Vext to the second node nd2 in response to the power up signal PWRUP of the high level. The second latch unit R2 receives the output of the level of the external power supply voltage Vext from the second node nd2 to output the output signal anti_anz of the low level.

Next, when the power up of the semiconductor integrated circuit is completed, the logic level of the power up signal PWRUP is shifted to the low level.

The fuse sense enable signal generator 310 receives the power up signal PWRUP of the low level and the program signal PG of the high level to generate the fuse sense enable signal FSEN having a high level period for a predetermined length of time.

Th switch unit 320 receives the fuse sense enable signal FSEN having the high level period for the predetermined length of time and connects between the second node nd2 and the anti-fuse F2 for the predetermined length of time in response to the fuse sense enable signal FSEN.

In this case, a current path is formed between the second node nd2 and the anti-fuse F2. When the power up signal PWRUP transitions to the high level, the external power supply voltage Vext stored in the second latch unit R2 is supplied to the anti-fuse and the voltage level of the second node nd2 is low. Therefore, when sufficient time lapses, the logic level of the second node nd2 transitions to the low level. The second latch unit R2 receives the output of the second node nd2 to output the output signal anti_anz of the high level.

Figure 3:
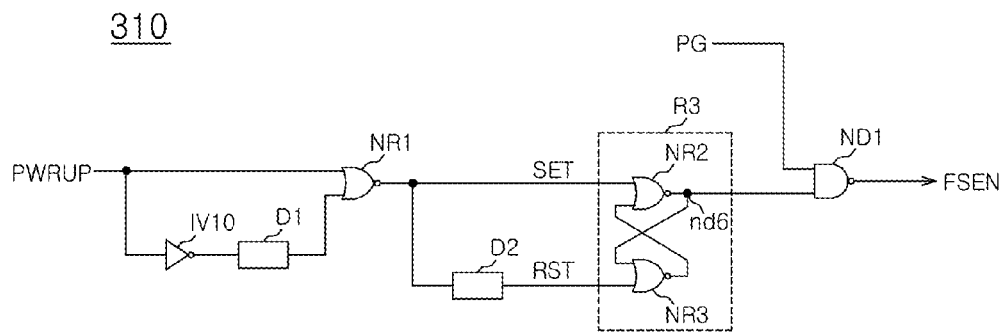
FIG. 3 is a circuit diagram of a fuse sense enable signal generator of FIG. 2.

FIG. 3 illustrates the fuse sense enable signal generator 310 of FIG. 2.

Referring to FIG. 3, the fuse sense enable generator 310 may be configured to include a tenth inverter IV10 that inverts and outputs the power up signal PWRUP. The fuse sense enable generator 310*a* may also include a first delay device D1 that delays the output of the tenth inverter IV10 for a predetermined length of time. Still further, the fuse sense enable generator 310 may include a first NOR gate NR1 that logically operates the first delay device D1, the power up signal PWRUP, and the output signal of the first delay device D1 to generate a set signal SET. The fuse sense enable generator 310*a* may further include a second delay device D2 that delays the set signal SET for a predetermined length of time to output a reset signal RST. The fuse sense enable generator 310*a* may also include a third latch unit R3 that receives and logically operates the set signal SET and the reset signal RST to generate an output signal of the sixth node nd6. Finally, the fuse sense enable generator 310*a* may include a first NAND gate ND1 that logically operates the output signal of the sixth node nd6 and the program signal PG to generate the fuse sense enable signal FSEN.

The third latch unit R3 may be configured to include a second NOR gate NR2 that logically operates the set signal SET and the output signal of the third NOR gate NR3, and a third NOR gate NR3 that logically operates the reset signal RST and the output signal of the second NOR gate NR2.

Figure 4:
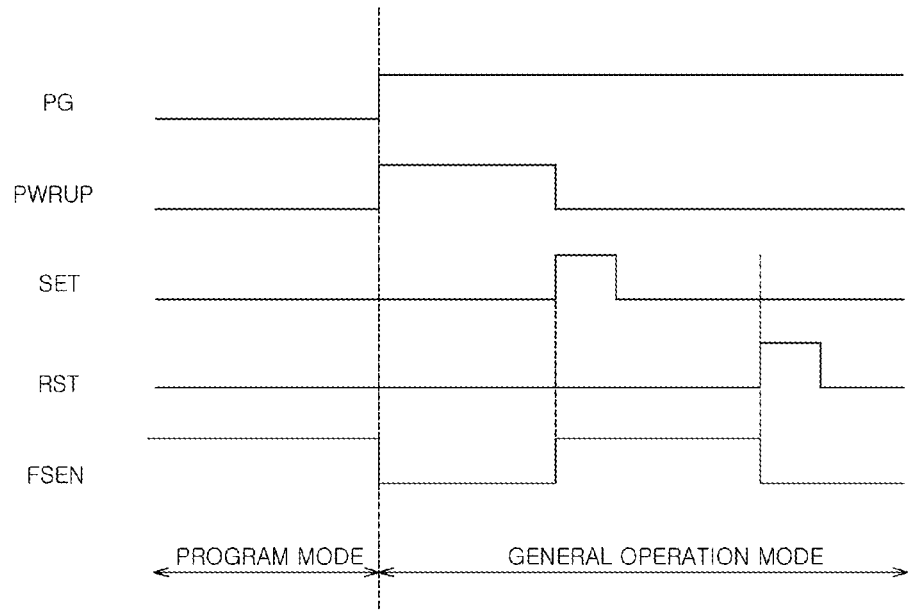
FIG. 4 is a timing chart of the fuse sense enable signal of FIG. 3.

FIG. 4 is a timing charge of the fuse sense enable signal FSEN.

An operation timing related to the fuse sense enable signal FSEN and an operation of the anti-fuse control circuit according to an embodiment of the present invention will be described as follows with reference to FIGS. 2 to 4.

First, the case of the program mode will be described. Referring to FIG. 3, in the case of the program mode, the first NAND gate ND1 receives the program signal PG of the low level regardless of the output of the sixth node nd6 such that the first NAND gate ND1 generates the fuse sense enable signal FSEN of the high level.

The switch unit 320 receives the fuse sense enable signal FSEN of the high level and supplies the voltage of the second node nd2 to the anti-fuse F2.

Next, the case of the general operation mode when the anti-fuse F2 is not programmed will be described below.

Here, when the anti-fuse F2 is not programmed, the first power supply voltage application unit 100 determines the voltage level of the second node nd2 according to the power up signal PWRUP.

In this case, in the state in which the anti-fuse F2 is opened, the voltage of the second node nd2 is not affected by the anti-fuse F2.

However, even though the anti-fuse F2 is in the open state, the fuse sense enable signal generator 310 generates the fuse sense enable signal FSEN.

More specifically, the operation in the power up state will be described as follows with reference to FIGS. 3 and 4.

In the power up state, the power up signal PWRUP is transitions to the high level. The fuse sense enable signal generator 310 generates the set signal SET of the low level and the reset signal RST of the low level for a period when the power up signal PWRUP becomes in the high level. The third latch unit R3 receives the set signal SET and the reset signal RST of the low level to generate the output signal of the sixth node 6. The first NAND gate ND1 receives the output signal of the sixth node nd6 and the program signal PG of the high level to generate the fuse sense enable signal FSEN of the low level.

In this case, an operation of the anti-fuse control circuit will be described with reference to FIG. 2. When the power up signal PWRUP of the high level is input to the first power supply voltage application unit 100, the voltage of the second node nd2 becomes the level of the external power supply voltage Vext. The second latch unit R2 receives the output from the second node nd2 to output the output signal anti_anz of the low level.

In this case, the switch unit 320 connected between the second node nd2 and the anti-fuse F2 blocks the voltage of the second node nd2 from being supplied to the anti-fuse F2.

The operation in the state in which the power up is completed will be described as follows with reference to FIGS. 3 and 4.

When the power up is completed, the power up signal PWRUP is shifted to the low level. When the power up signal PWRUP is shifted to the low level, the fuse sense enable signal generator 310 generates the set signal SET having the high level period for as long as the delay length of the first delay device D1. In addition, the fuse sense enable signal generator 310 shifts the set signal SET to the high level and generates the reset signal RST having the high level period for as much as the delay length of the first delay device D1, but the reset signal RST having the high level is generated after the predetermined length of time lapses corresponding to the delay length of the second delay device D2. In this case, the fuse sense enable signal generator 310 generates the fuse sense enable signal FSEN having the high level for a period as long as the delay length of the second delay element D2, that is from the time when the set signal SET is shifted to the high level to the time when the reset signal RST is shifted to the high level.

In this case, an operation of the anti-fuse control circuit will be described with reference to FIG. 2. The switch unit 320 connected between the second node nd2 and the anti-fuse F2 connects the second node nd2 with the anti-fuse F2. However, the anti-fuse F2 is in the open state and thus, the current path is not formed between the second node nd2 and the anti-fuse F2.

When the power up signal PWRUP of the low level is input to the first power supply voltage application unit 100, the external power supply voltage Vext is not applied to the second node nd2. However, the second latch unit R2 allows the first power supply voltage application unit 100—before the power up signal PWRUP is shifted to the low level—to maintain the external power supply is voltage Vext output to the second node nd2 at the second node nd2. Therefore, the second latch unit R2 outputs the output signal anti_anz of the low level.

Next, the case of the general operation mode when the anti-fuse F2 is programmed will be described below.

First, the operation in the power up state will be described as follows with reference to FIGS. 3 and 4.

In the power up state of the semiconductor integrated circuit, the power up signal PWRUP transitions to the high level. The fuse sense enable signal generator 310 generates the set signal SET of the low level and the reset signal RST of the low level for a period when the power up signal PWRUP becomes in the high level. The third latch unit R3 receives the set signal SET and the reset signal RST of the low level to generate the output signal of the sixth node 6. The first NAND gate ND1 receives the output signal of the sixth node nd6 and the program signal PG of the high level to generate the fuse sense enable signal FSEN of the low level.

In this case, an operation of the anti-fuse control circuit will be described with reference to FIG. 2.

The first power supply voltage application unit 100 receiving the power up signal PWRUP of the high level outputs the external power supply voltage Vext to the second node nd2.

However, the switch unit 320 connected between the second node nd2 and the anti-fuse F2 receives the fuse sense enable signal FSEN of the low level to block the current path between the second node nd2 and the anti-fuse F2.

The second latch unit R2 receives the external power supply voltage Vext from the first power supply voltage application unit 100 via the second node nd2 to output the output signal anti_anz of the low level.

The operation in the state in which the power up is completed will be described as follows with reference to FIGS. 3 and 4.

When the power up state of the semiconductor integrated circuit is completed, the power up signal PWRUP is shifted to the low level. When the power up signal PWRUP is shifted to the low level, the fuse sense enable signal generator 310 generates the set signal SET having the high level period for the same length of time as the delay length of the first delay device D1. In addition, the fuse sense enable signal generator 310 shifts the set signal SET to the high level and generates the reset signal RST having the high level period for a same length of time as the delay length of the first delay device D1. The reset signal RST transitions to the high level after the predetermined length of time lapses corresponding to the delay length of the second delay device D2. In this case, the fuse sense enable signal generator 310 generates the fuse sense enable signal FSEN having the high level period for as long as the delay length of the second delay element D2 from the time when the set signal SET is shifted to the high level to the time when the reset signal RST is shifted to the high level.

Therefore, in the case of the general operation mode in the state in which the anti-fuse F2 is programmed, when the power up of the semiconductor integrated circuit is completed and the shifting to the low level is performed, the fuse sense enable signal FSEN having the high level period as much as the delay length of the second delay device D2 is generated.

The switch unit 320 connected between the second node nd2 and the anti-fuse F2 receives the fuse sense enable signal FSEN having high level for the same length of time as the delay length of the second delay device D2 to form the current path between the second node nd2 and the anti-fuse F2 for the predetermined length of time. The voltage level of the second node nd2 is low by the current path from the level of the external voltage Vext maintained by the second latch unit R2. When the fuse sense enable signal FSEN transitions to the low level after the predetermined length of time lapses, the current path between the second node nd2 and the anti-fuse F2 is blocked.

The second latch unit R2 outputs the output signal anti_anz of the high level when the voltage level of the second node nd2 is reduced and thus, becomes the logic low level.

While certain embodiments have been described above, it will be understood to those skilled in the art that the embodiments described are by way of example only. Accordingly, the device described herein should not be limited based on the described embodiments. Rather, the apparatus described herein should only be limited in light of the claims that follow when taken in conjunction with the above description and accompanying drawings.

What is claimed is:

1. An anti-fuse control circuit, comprising:
   a first power supply voltage application unit configured to selectively apply first power supply voltage to an output node in response to a power up signal;
   a second power supply voltage application unit configured to selectively apply second power supply voltage to the output node in response to a program signal; and
   a control unit configured to receive the power up signal and the program signal and control a connection between the output node and an anti-fuse in response to the power up signal and the program signal.

2. The anti-fuse control circuit of claim 1, further comprising a latch unit configured to latch and output an output signal of the output node.

3. The anti-fuse control circuit of claim 1, wherein the control unit applies the second power supply voltage to the anti-fuse when the program signal is activated.

4. The anti-fuse control circuit of claim 1, wherein the control unit selectively applies the first power supply voltage to the anti-fuse in response to the power up signal when the program signal is inactivated.

5. The anti-fuse control circuit of claim 4, wherein the control unit blocks the first power voltage from being applied to the anti-fuse when the power up signal is activated.

6. The anti-fuse control circuit of claim 4, wherein the control unit applies the first power supply voltage to the anti-fuse for a predetermined length of time from the inactivated timing when the power up signal is inactivated.

7. The anti-fuse control circuit of claim 1, wherein the control unit includes:
   a fuse sense enable signal generator that generates a fuse sense enable signal controlling a connection between the output node and the anti-fuse in response to the power up signal and the program signal; and
   a switch unit that selectively connects the output node with the anti-fuse in response to the fuse sense enable signal.

8. The anti-fuse control circuit of claim 7, wherein the fuse sense enable signal generator includes:
   an inverter that inverts and outputs the power up signal;
   a first delay device that delays and outputs the output signal of the inverter by a predetermined length of time;
   a NOR gate that logically operates the power up signal and an output signal of the first delay device;
   a second delay device that delays and outputs the output of the NOR gate by predetermined length of time;
   a latch that latches the output signal of the NOR gate and the output signal of the second delay device; and
   a NAND gate that logically operates the output signal of the latch and the program signal to generate the fuse sense enable signal.

9. The anti-fuse control circuit of claim 7, wherein the switch unit includes:
   an inverter that inverts and outputs the fuse sense enable signal;
   a PMOS transistor that is connected between the output node and the anti-fuse to receive the output signal of the inverter; and
   an NMOS transistor that is connected between the output node and the antifuse to receive the fuse sense enable signal.

10. The anti-fuse control circuit of claim 1, wherein the first power supply voltage application unit includes:
    an inverter that inverts and outputs the power up signal; and
    a first PMOS transistor that receives the output signal of the inverter through a gate thereof and selectively applies the first power supply voltage to the output node.

11. The anti-fuse control circuit of claim 1, wherein the second power supply voltage application unit includes a first PMOS transistor that receives the program signal through a gate thereof and selectively applies the second power supply voltage to the output node.

* * * * *